United States Patent [19]

Weitzel et al.

[11] Patent Number: 4,870,478

[45] Date of Patent: Sep. 26, 1989

[54] DUAL-GATE GALLIUM ARSENIDE POWER METAL SEMICONDUCTOR FIELD EFFECT TRANSISTOR

[75] Inventors: Charles E. Weitzel, Tempe, Ariz.; Lalgudi M. G. Sundaram, Scottsdale, Ariz.; Steven C. Lazar, Jr., Plano, Tex.

[73] Assignee: Motorola, Inc., Schaumburg, Ill.

[21] Appl. No.: 184,213

[22] Filed: Apr. 21, 1988

[51] Int. Cl.[4] .......................................... H01L 29/80
[52] U.S. Cl. ...................................... 357/22; 357/15
[58] Field of Search ................ 357/228, 22 I, 22 G, 357/15, 23.14

[56] References Cited

U.S. PATENT DOCUMENTS 4,298,879 11/1981 Hirano ............................... 357/22 I 4,709,251 11/1987 Suzuki ................................... 357/22

FOREIGN PATENT DOCUMENTS 54-101285 8/1979 Japan .................................. 357/228

Primary Examiner—Andrew J. James
Assistant Examiner—Mark Prenty
Attorney, Agent, or Firm—Joe E. Barbee

[57] ABSTRACT

A dual-gate gallium arsenide power MESFET chip comprising a source region surrounded by a first gate, a second surrounding the first gate, a drain region juxtaposed to said second gate, and a shorting bar which couples the second gate to the source region. This combination, used in a multi-fingered application, provides a reverse breakdown voltage substantially higher than prior art devices.

4 Claims, 2 Drawing Sheets

DUAL-GATE GALLIUM ARSENIDE POWER METAL SEMICONDUCTOR FIELD EFFECT TRANSISTOR

BACKGROUND OF THE INVENTION

This invention relates to radio frequency power modules and, in particular, to power metal semiconductor field effect transistors (MESFETs).

Power MESFETs are often utilized in portable, cellular radio transmitters. Unfortunately, the useful range of these MESFETs exists only up to the point of reverse breakdown voltage (i.e., in the linear region of the drain current). When the drain voltage increases past the reverse breakdown voltage point, the drain current, and consequently the power, increases rapidly in the transmitter. Thus, the higher the reverse breakdown voltage in the MESFET, the more efficient the transmitter will be since the size of the battery and heat sinks needed in the transmitter can be reduced. The battery size required can be reduced due to decreased current drain and the heat sinks can be reduced in size due to decreased power.

Prior art power MESFETs utilizing a single gate provide an inadequate reverse breakdown voltage for many applications. For instance, when the gate voltage is zero and the drain current is 12 mA, a prior art device having a four cell structure with total gate width of 12 mm. has a reverse breakdown voltage of approximately only 24 V. A new power MESFE providing a higher reverse breakdown voltage is needed to produce smaller and more efficient radio transmitters.

SUMMARY OF THE INVENTION

It is an object of the present invention to provide a new and improved gallium arsenide power MESFET which utilizes a dual-gate to produce a large increase in reverse breakdown voltage over prior art devices.

It is another object of the present invention to provide a new and improved gallium arsenide power MESFET which enables the manufacturing of smaller and more efficient portable, cellular radio transmitters.

These and other objects and advantages of the present invention are achieved by a power MESFET chip comprising a source partially surrounded by a first gate, a second gate partially surrounding the first gate, a drain region juxtaposed to the second gate, a shorting block coupling the second gate to the source region by wrapping itself around the first gate. Modifications of the present invention utilize multiple cell, multi-fingered MESFETs.

The objects and advantages described above will become apparent to those skilled in the art upon consideration of the accompanying specification and drawings.

BRIEF DESCRIPTION OF THE DRAWINGS

Referring to the drawings wherein like characters indicate like parts throughout the Figures.

DESCRIPTION OF THE PREFERRED EMBODIMENT

Figure 1:
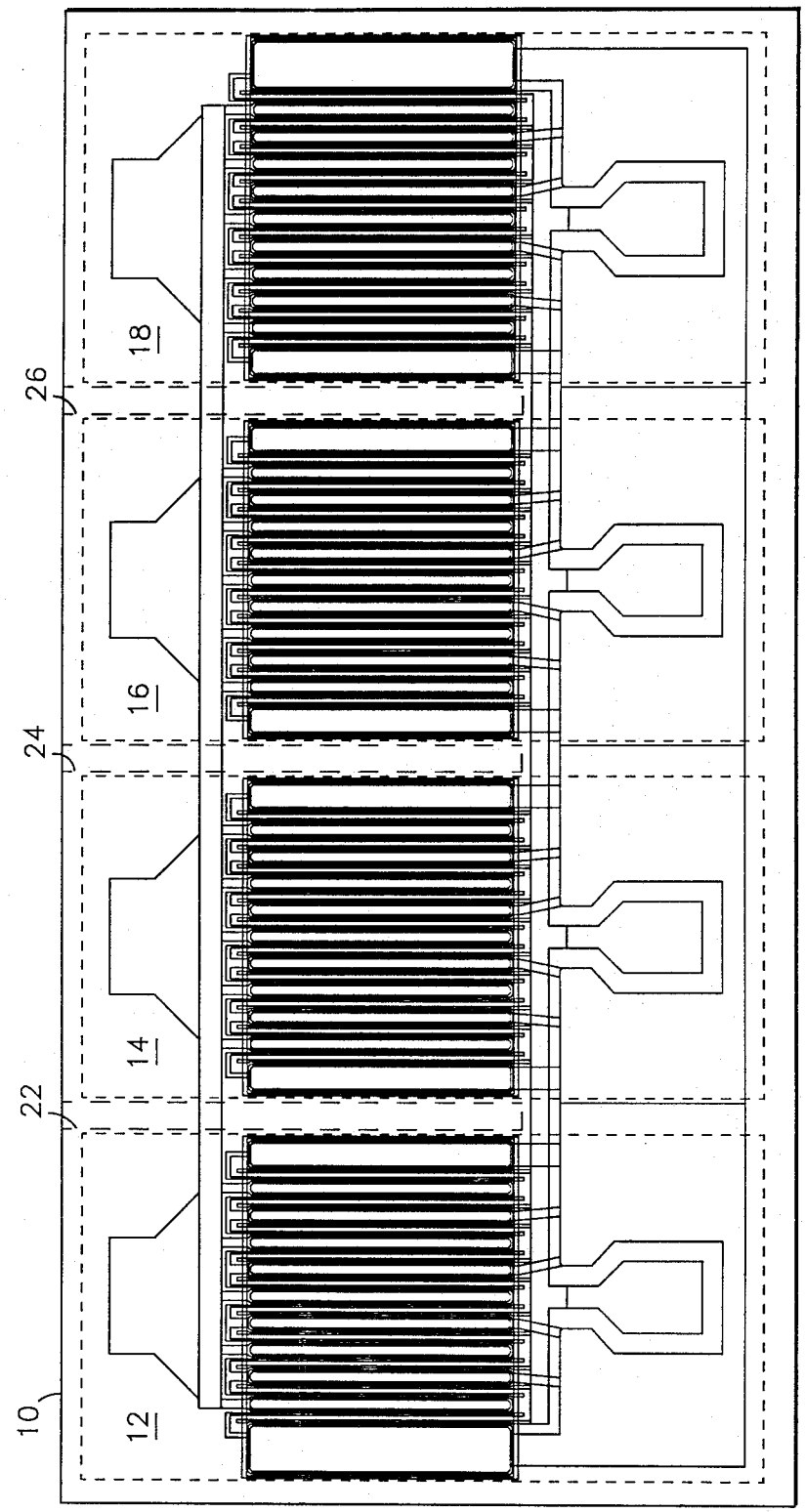
FIG. 1 illustrates a cross-sectional view of a four cell power MESFET semiconductor chip embodying the present invention.

Referring specifically to FIG. 1, cells 12, 14, 16, and 18 are illustrated on semiconductor chip 10. Semiconductor chip 10 is most commonly comprised of gallium arsenide for higher frequency applications such as radio transmitters. Each of cells 12, 14, 16 and 18 is a multi-fingered powered MESFET. Dotted lines 22, 24, and 26 indicate separators between cells.

Figure 2:
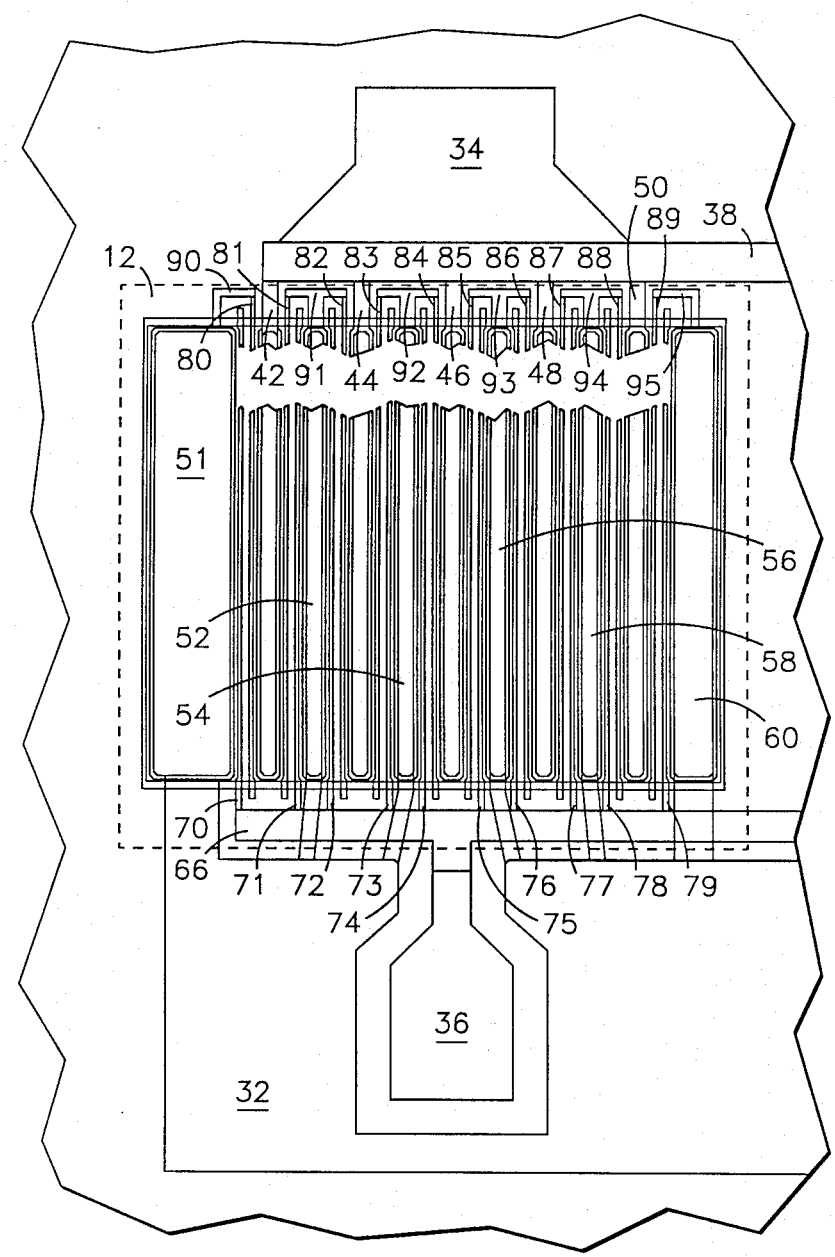
FIG. 2 represents an exploded view of the first cell of FIG. 1.

Referring specifically to FIG. 2, an exploded view of cell 12 is illustrated with the components more easily distinguishable. Cell 12 possesses a source probe pad 32, a drain probe pad 34, and a gate probe pad 36.

A drain column 38 is coupled to drain probe pad 34. Drain column 38 is connected to drains 42, 44, 46, 48 and 50. Drains 42, 44, 46, 48 and 50 are often referred to as drain fingers.

Source probe pad 32 is coupled to sources 51, 52, 54, 56, 58, and 60. It should be noted that source probe pad 32 and thus, sources 51, 52, 54, 56, 58, and 60 are often coupled to ground.

A gate column 66 is coupled to gate probe pad 36. Gate fingers 70, 71, 72, 73, 74, 75, 76, 77, 78 and 79 are connected to gate column 66. Gate fingers 71 and 72 form a first gate for source 52; gate fingers 73 and 74 form a first gate for source 54; gate fingers 75 and 76 form a first gate for source 56; and gate fingers 77 and 78 form a first gate for source 58. Gate finger 70 forms a first gate for source 51 and gate finger 79 forms a first gate for source 60.

Gate finger 80 is positioned between gate finger 70 and drain 42; gate finger 81 is positioned between drain 42 and gate finger 71; gate finger 82 is positioned between gate finger 72 and drain 44; gate finger 83 is positioned between drain 44 and gate finger 73; gate finger 84 is positioned between gate finger 74 and drain 46; gate finger 85 is positioned between drain 46 and gate finger 75; gate finger 86 is positioned between gate finger 76 and drain 48; gate finger 87 is positioned between drain 48 and gate finger 77; gate finger 88 is positioned between gate finger 78 and drain 50; and gate finger 89 is positioned between drain 50 and gate finger 79. Gate fingers 81 and 82 create a second gate for source 52; gate fingers 83 and 84 create a second gate for source 54; gate fingers 85 and 86 create a second gate for source 56; and gate fingers 87 and 88 create a second gate for source 58. Gate finger 80 creates a second gate for source 51 and gate finger 89 creates a second gate for source 60.

Shorting bar 90 couples gate 80 to source 51 by wrapping around gate finger 70; shorting bar 91 couples gate fingers 81 and 82 to source 52 by wrapping around gate fingers 71 and 72; shorting bar 92 couples gate fingers 83 and 84 to source 54 by wrapping around gate fingers 73 and 74; shorting bar 93 couples gate fingers 85 and 86 to source 56 by wrapping around gate fingers 75 and 76; shorting bar 94 couples gate fingers 87 and 88 to source 58 by wrapping around gate fingers 77 and 78; and shorting bar 95 couples gate finger 89 to source 60 by wrapping around gate finger 79.

Cells 14, 16 and 18 of FIG. 1 are similar to the description of cell 12 in FIG. 2. However, it should be apparent to those skilled in the art that various numbers of gates, drains, and sources may be utilized in the multi-fingered cells. Furthermore, while a four cell chip has been illustrated in FIG. 1, a different number of cells may be utilized.

By utilizing the dual-gate power MESFET and shorting bars of FIG. 1, a large increase in reverse breakdown voltage is achieved. For instance, when the gate voltage is zero and the drain current is 12 mA, the four cell structure of FIG. 1 with a total gate width of 12 mm. has a reverse breakdown voltage of approximately 43 volts. This value of reverse breakdown voltage is nearly double the reverse breakdown voltage achieved with similar sized prior art devices.

While the specific embodiment of this invention has been shown and described, further modifications and improvements will occur to those skilled in the art. We desire it to be understood therefore, that this invention is not limited to the particular form shown and we intend to cover all modifications which do not depart from the spirit and scope of the invention.

We claim:

1. A multi-fingered power MESFET chip comprising:
    a plurality of source regions commonly coupled to a source probe pad;
    a plurality of first gates commonly coupled to a gate probe pad wherein one of said plurality of said first gates is positioned so as to partially enclose each of said plurality of source regions;
    a plurality of second gates capable of being coupled to external components wherein one of said plurality of second gates is positioned so as to partially enclose each of said plurality of first gates;
    a plurality of drain regions commonly coupled to a drain probe pad wherein one of said plurality of said drain regions is juxtaposed to each of said plurality of second gates; and
    a plurality of shorting bars wherein one of said plurality of shorting bars couples one of said plurality of second gates to one of said plurality of source regions by wrapping around each of said plurality of first gates.

2. A gallium arsenide semiconductor chip comprising a plurality of multi-fingered dual-gate power MESFETs wherein each of said plurality of multi-fingered dual-gate power MESFETs comprises:
    a plurality of source regions commonly coupled to a source probe pad;
    a plurality of first gates commonly coupled to a gate probe pad wherein one of said plurality of said first gates is positioned so as to partially enclose each of said plurality of source regions;
    a plurality of second gates capable of being coupled to external components wherein one of said plurality of second gates is positioned so as to partially enclose each of said plurality of first gates;
    a plurality of drain regions commonly coupled to a drain probe pad wherein one of said plurality of drain regions is juxtaposed to each of said plurality of second gates; and
    a plurality of shorting bars wherein one of said plurality of shorting bars couples one of said plurality of second gates to one of said plurality of source regions by wrapping around each of said plurality of first gates.

3. A power MESFET chip comprising: at least two source regions; a drain region formed between the at least two source regions; a first gate adjacent to each source region formed between each source region and the drain; and a second gate adjacent to the drain region formed between the drain and each source region, wherein the second gate is shorted to each of the source regions.

4. A multi-fingered power MESFET chip comprising; a plurality of source fingers coupled in parallel; a plurality of drain fingers coupled in parallel, wherein each drain finger is formed between two of the source fingers; a plurality of first gate fingers coupled in parallel, each first gate finger formed between each source finger and each drain finger and adjacent to each source finger; and a plurality of second gate fingers coupled in parallel, each second gate finger formed between each first gate finger and each drain finger and shorted to each source finger.

* * * * *